(12) United States Patent
Tajikara et al.

(10) Patent No.: US 9,478,696 B2
(45) Date of Patent: Oct. 25, 2016

(54) WORKPIECE CUTTING METHOD

(71) Applicant: HAMAMATSU PHOTONICS K.K., Hamamatsu-shi, Shizuoka (JP)

(72) Inventors: Yoko Tajikara, Hamamatsu (JP); Takeshi Yamada, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/422,372

(22) PCT Filed: Aug. 1, 2013

(86) PCT No.: PCT/JP2013/070906
§ 371 (c)(1),
(2) Date: Feb. 19, 2015

(87) PCT Pub. No.: WO2014/030519
PCT Pub. Date: Feb. 27, 2014

(65) Prior Publication Data
US 2015/0221816 A1    Aug. 6, 2015

(30) Foreign Application Priority Data

Aug. 22, 2012 (JP) ................................ 2012-183488

(51) Int. Cl.
| | | |
|---|---|---|
| *H01L 33/00* | (2010.01) | |
| *B23K 26/00* | (2014.01) | |
| *H01L 33/48* | (2010.01) | |

(52) U.S. Cl.
CPC ....... *H01L 33/0066* (2013.01); *B23K 26/0006* (2013.01); *B23K 26/0057* (2013.01); *H01L 33/0075* (2013.01); *H01L 33/48* (2013.01); *B23K 2203/56* (2015.10); *H01L 2933/0033* (2013.01)

(58) Field of Classification Search
CPC ......................... H01L 33/0066; H01L 33/007
See application file for complete search history.

(56) References Cited

U.S. PATENT DOCUMENTS

2012/0292642 A1* 11/2012 Urata .................. H01L 29/045
257/77

FOREIGN PATENT DOCUMENTS

| CN | 102126232 | 1/2012 |
|---|---|---|
| JP | 2006-179790 A | 7/2006 |
| JP | 2006-245043 A | 9/2006 |

(Continued)

OTHER PUBLICATIONS

International Preliminary Report on Patentability mailed Mar. 5, 2015 for PCT/JP2013/070906.

*Primary Examiner* — Daniel Shook
(74) *Attorney, Agent, or Firm* — Drinker Biddle & Reath LLP

(57) ABSTRACT

The object cutting method comprises a step of locating a converging point of laser light within a monocrystal sapphire substrate, while using a rear face of the monocrystal sapphire substrate as an entrance surface of the laser light, and relatively moving the converging point along each of a plurality of lines to cut set parallel to the m-plane and rear face of the substrate, so as to form first and second modified regions within the substrate along each line and cause a fracture to reach a front face. In this step, in each line, with respect to a tilted surface passing the first region while being parallel to the r-plane of the substrate, the second region is positioned on the side where the tilted surface and rear face form an acute angle.

3 Claims, 17 Drawing Sheets

(56) References Cited

FOREIGN PATENT DOCUMENTS

| JP | 2011-181909 A | 9/2011 |
| JP | 2012-146878 A | 8/2012 |
| WO | WO-2009/020033 A1 | 2/2009 |
| WO | WO-2011/090024 A1 | 7/2011 |
| WO | WO-2012/029735 A1 | 3/2012 |

* cited by examiner (a)

(b)

(a)

(b)

WORKPIECE CUTTING METHOD

TECHNICAL FIELD

The present invention relates to an object cutting method for manufacturing a plurality of light-emitting elements by cutting an object to be processed, comprising a monocrystal sapphire substrate, with respect to each of light-emitting element parts.

BACKGROUND ART

As a conventional object cutting method in the above-mentioned technical field, Patent Literature 1 discloses a method in which separation grooves are formed on front and rear faces of a sapphire substrate by dicing or scribing, and process-modified parts are formed in multiple stages within the sapphire substrate by irradiation with laser light, and then the sapphire substrate is cut along the separation grooves and process-modified parts.

CITATION LIST

Patent Literature

Patent Literature 1: Japanese Patent Application Laid-Open No. 2006-245043

SUMMARY OF INVENTION

Technical Problem

Meanwhile, in order to cut an object to be processed, comprising the monocrystal sapphire substrate having front and rear faces forming an angle corresponding to an off-angle with the c-plane, with respect to each of light-emitting element parts, when modified regions are formed within the monocrystal sapphire substrate by irradiation with laser light, fractures occurring from the modified regions formed along each of a plurality of lines to cut which are parallel to the m-plane and rear face of the monocrystal sapphire substrate may reach the light-emitting element parts, thereby lowering the yield of light-emitting elements to be manufactured.

It is therefore an object of the present invention to provide an object cutting method which can prevent fractures occurring from modified regions formed along each of a plurality of lines to cut which are parallel to the m-plane and rear face of a monocrystal sapphire substrate from reaching light-emitting element parts.

Solution to Problem

For achieving the above-mentioned object, the inventors conducted diligent studies and, as a result, have found out that fractures occurring from modified regions formed along each of a plurality of lines to cut which are parallel to the m-plane and rear face of a monocrystal sapphire substrate reach light-emitting element parts because of a relationship between the m- and r-planes in the monocrystal sapphire substrate. That is, the extending direction of a fracture occurring from a modified region formed along a line to cut parallel to the m-plane and rear face of the monocrystal sapphire substrate is influenced more by the r-plane tilted with respect to the m-plane than by the m-plane, so as to be pulled toward the tilting direction of the r-plane, whereby the fracture may reach the light-emitting element part. The inventors have further conducted studies based on this finding, thereby completing the present invention.

That is, the object cutting method in accordance with one aspect of the present invention is an object cutting method for manufacturing a plurality of light-emitting elements by cutting an object to be processed, comprising a monocrystal sapphire substrate having front and rear faces forming an angle corresponding to an off-angle with c-plane and an element layer including a plurality of light-emitting element parts arranged in a matrix on the front face, with respect to each of the light-emitting element parts, the method comprising a first step of locating a converging point of laser light at a position separated by a first distance from the rear face within the monocrystal sapphire substrate, while using the rear face as an entrance surface of laser light in the monocrystal sapphire substrate, and relatively moving the converging point along each of a plurality of first lines to cut set parallel to m-plane of the monocrystal sapphire substrate and the rear face, so as to form first modified regions within the monocrystal sapphire substrate along each of the first lines and locating the converging point at a position separated by a second distance shorter than the first distance from the rear face within the monocrystal sapphire substrate, while using the rear face as the entrance surface of laser light in the monocrystal sapphire substrate, and relatively moving the converging point along each of the first lines, so as to form second modified regions within the monocrystal sapphire substrate along each of the first lines; and a second step of exerting an external force on the object along each of the first lines after the first step, so as to extend a first fracture occurring from the first modified regions and a second fracture occurring from the second modified regions, thereby cutting the object along each of the first lines; in the first step, in each of the first lines, with respect to a tilted surface passing the first modified regions while being parallel to r-plane of the monocrystal sapphire substrate, the second modified regions are positioned on a side where the tilted surface and rear face form an acute angle.

In each of a plurality of first lines to cut set parallel to the m-plane and rear face of a monocrystal sapphire substrate, with respect to a tilted surface passing the first modified region while being parallel to the r-plane of the monocrystal sapphire substrate, this object cutting method positions the second modified region on the side where the tilted surface and rear face form an acute angle. This causes the first fracture extending from the first modified region toward the rear face of the monocrystal sapphire substrate to extend toward the second modified region and the second fracture extending from the second modified region to the front face of the monocrystal sapphire substrate to extend toward the first modified region, whereby the first and second fractures connect with each other. Therefore, the first fracture occurring from the first modified region can be contained in a street region while inhibiting the second fracture occurring from the second modified region on the rear face side from extending to the front face of the monocrystal sapphire substrate. Hence, this object cutting method can prevent the modified regions formed along each of a plurality of lines to cut which are parallel to the m-plane and rear face of the monocrystal sapphire substrate from reaching the light-emitting element parts. The off-angle may be 0°. In this case, the front and rear faces of the monocrystal sapphire substrate are parallel to the c-plane.

Here, in the first step, the converging point may be located at the position separated by the second distance from the rear face within the monocrystal sapphire substrate, while using the rear face as the entrance surface of laser light in the monocrystal sapphire substrate, and the converging point may be relatively moved along each of the first lines, so as to form the second modified regions within the monocrystal sapphire substrate along each of the first lines and cause the second fracture to reach the rear face, and in the second step, the external force may be exerted on the object along each of the first lines by pressing a knife edge against the object from the front face side along each of the first lines. This enables the external force to act on the object such that the second fracture having reached the rear face of the monocrystal sapphire substrate opens, thereby making it possible to cut the object easily and accurately along the first lines.

The object cutting method may further comprise a third step of locating the converging point within the monocrystal sapphire substrate, while using the rear face as the entrance surface, and relatively moving the converging point along each of a plurality of second lines to cut set parallel to a-plane of the monocrystal sapphire substrate and the rear face, so as to form third modified regions within the monocrystal sapphire substrate along each of the second lines before the second step; and a fourth step of exerting an external force on the object along each of the second lines after the first and third steps, so as to extend a third fracture occurring from the third modified regions, thereby cutting the object along each of the second lines. This can easily and accurately cut the object along the first and second lines. The third step may be performed either before or after the first step as long as it occurs before the second step. The fourth step may be performed either before or after the fourth step as long as it occurs after the first and third steps.

Advantageous Effects of Invention

The present invention can provide an object cutting method which can prevent fractures occurring from modified regions formed along each of a plurality of lines to cut which are parallel to the m-plane and rear face of a monocrystal sapphire substrate from reaching light-emitting element parts.

DESCRIPTION OF EMBODIMENTS

Figure 1:
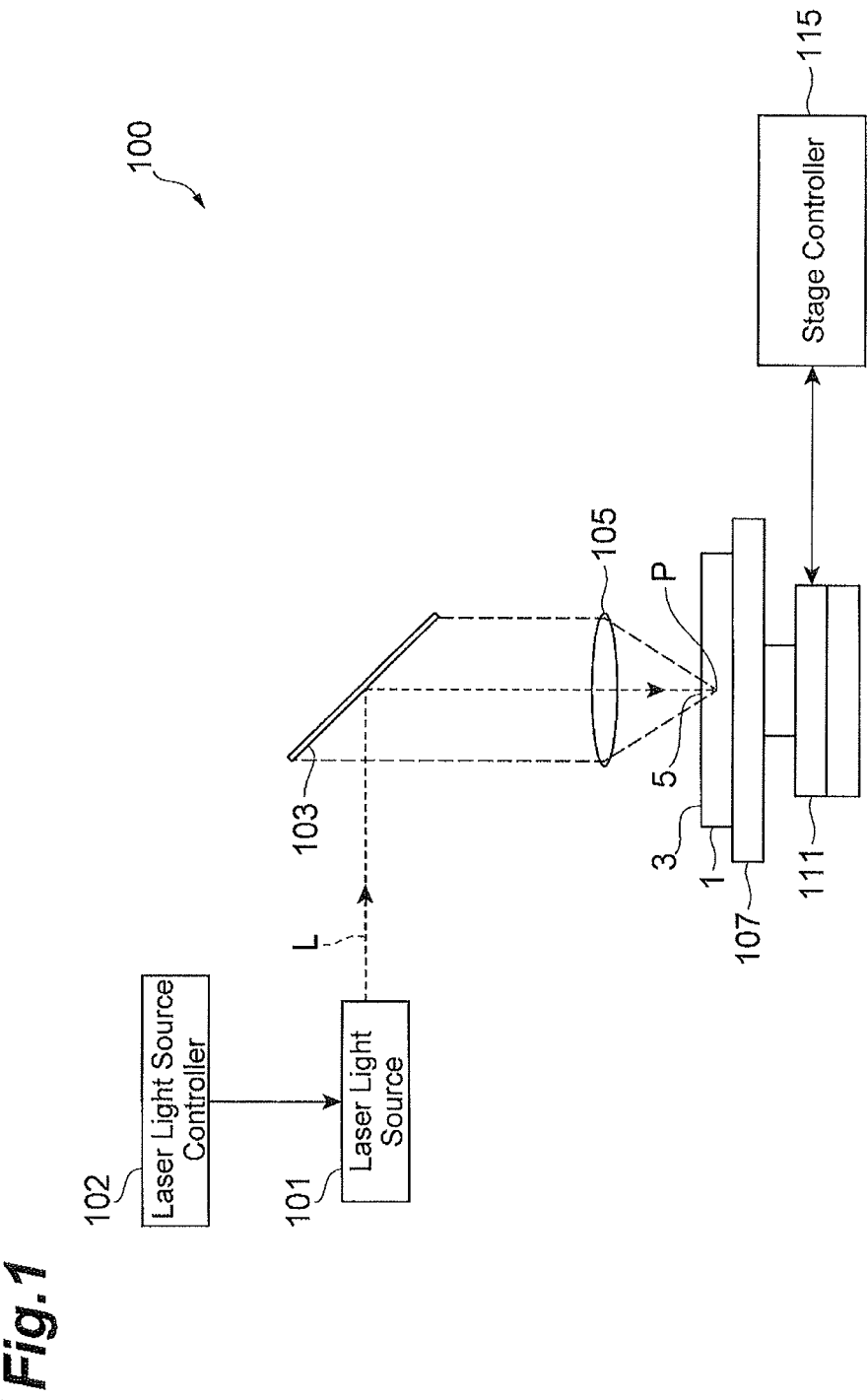
FIG. 1 is a schematic structural diagram of a laser processing device used for forming a modified region.

In the following, preferred embodiments of the present invention will be explained in detail with reference to the drawings. In the drawings, the same or equivalent parts will be referred to with the same signs while omitting their overlapping descriptions.

The object cutting method in accordance with an embodiment of the present invention irradiates an object to be processed with laser light along a line to cut, so as to form a modified region within the object along the line. Therefore, the forming of the modified region will be explained at first with reference to FIGS. 1 to 6.

As illustrated in FIG. 1, a laser processing device 100 comprises a laser light source 101 for causing laser light L to oscillate in a pulsating manner, a dichroic mirror 103 arranged such as to change the direction of the optical axis (optical path) of the laser light L by 90°, and a condenser lens (condenser optical system) 105 for condensing the laser light L. The laser processing device 100 further comprises a support table 107 for supporting an object to be processed 1 which is irradiated with the laser light L condensed by the condenser lens 105, a stage 111 for moving the support table 107, a laser light source controller 102 for regulating the laser light source 101 in order to adjust the output, pulse width, pulse waveform, and the like of the laser light L, and a stage controller 115 for regulating the movement of the stage 111.

In the laser processing device 100, the laser light L emitted from the laser light source 101 changes the direction of its optical axis by 90° with the dichroic mirror 103 and then is condensed by the condenser lens 105 into the object 1 mounted on the support table 107. At the same time, the stage 111 is shifted, so that the object 1 moves relative to the laser light L along a line to cut 5. This forms a modified region in the object 1 along the line 5.

Figure 2:
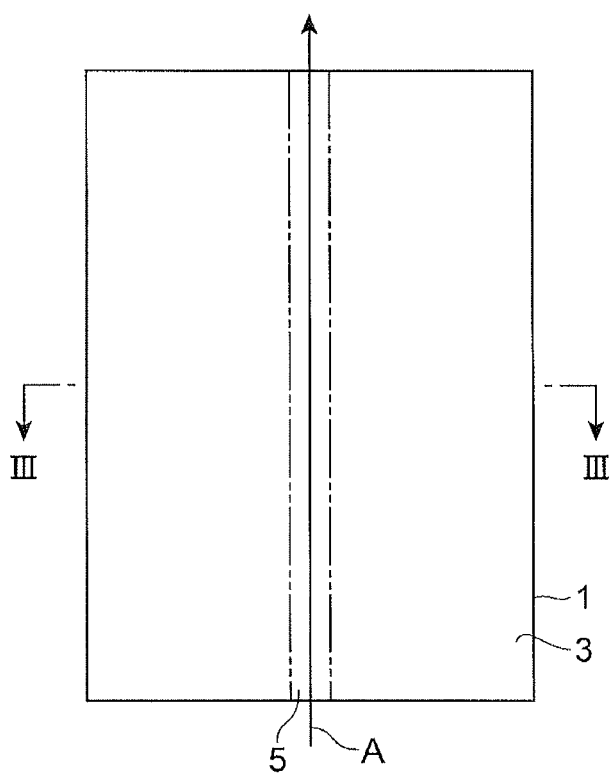
FIG. 2 is a plan view of an object to be processed for which the modified region is formed.
Figure 3:
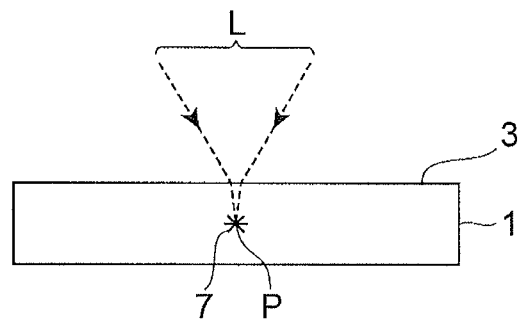
FIG. 3 is a sectional view of the object taken along the line III-III of FIG. 2.
Figure 4:
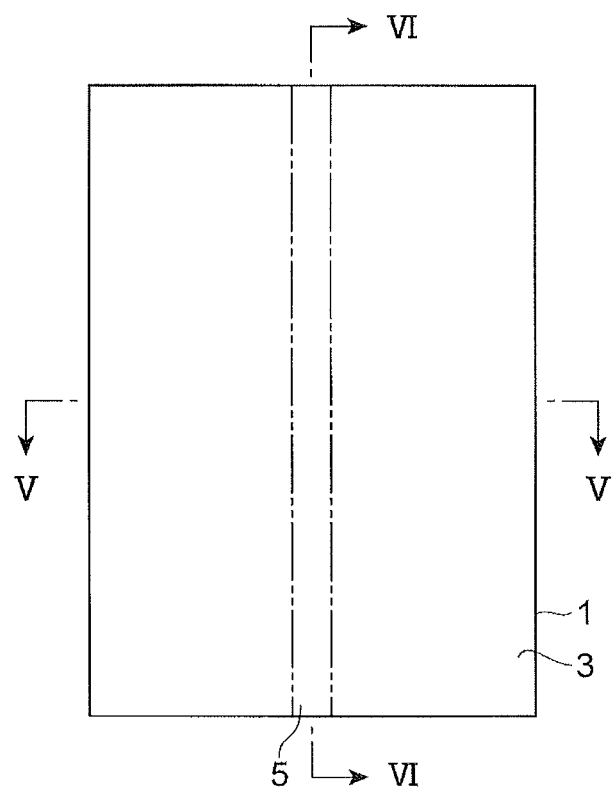
FIG. 4 is a plan view of the object after laser processing.
Figure 5:
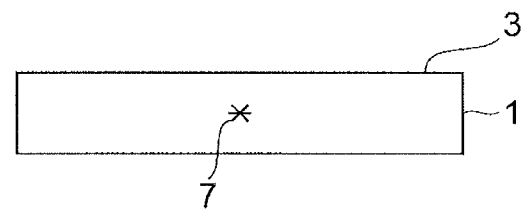
FIG. 5 is a sectional view of the object taken along the line V-V of FIG. 4.
Figure 6:
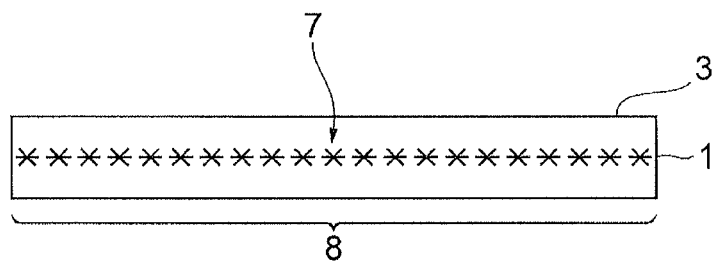
FIG. 6 is a sectional view of the object taken along the line VI-VI of FIG. 4.

As illustrated in FIG. 2, the line 5 for cutting the object 1 is set in the object 1. The line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 formed along the line 5 becomes a cutting start region 8.

The converging point P is a position at which the laser light L is condensed. The line 5 may be curved instead of being straight and may be one actually drawn on a front face 3 of the object 1 without being restricted to the virtual line. The modified region 7 may be formed either continuously or intermittently. The modified region 7 may be formed either in rows or dots and is only required to be formed at least within the object 1. There are cases where fractures are formed from the modified region 7 acting as a start point, and the fractures and modified region 7 may be exposed at outer surfaces (the front face 3, rear face 21, and outer peripheral surface) of the object 1.

Here, the laser light L is absorbed in particular in the vicinity of the converging point within the object 1 while being transmitted therethrough, whereby the modified region 7 is formed in the object 1 (i.e., internal absorption type laser processing). Therefore, the front face 3 of the object 1 hardly absorbs the laser light L and thus does not melt. In the case of forming a removing part such as a hole or groove by melting it away from the front face 3 (surface absorption type laser processing), the processing region gradually progresses from the front face 3 side to the rear face side in general.

By the modified region formed in this embodiment are meant regions whose physical characteristics such as density, refractive index, and mechanical strength have attained states different from those of their surroundings. Examples of the modified region include molten processed regions, crack regions, dielectric breakdown regions, refractive index changed regions, and their mixed regions. Other examples of the modified region include areas where the density of the modified region has changed from that of an unmodified region and areas formed with a lattice defect in a material of the object (which may also collectively be referred to as high-density transitional regions).

The molten processed regions, refractive index changed regions, areas where the modified region has a density different from that of the unmodified region, or areas formed with a lattice defect may further incorporate a fracture (fissure or microcrack) therewithin or at an interface between the modified and unmodified regions. The incorporated fracture may be formed over the whole surface of the modified region or in only a part or a plurality of parts thereof.

This embodiment forms a plurality of modified spots (processing scars) along the line 5, thereby producing the modified region 7. The modified spots, each of which is a modified part formed by a shot of one pulse of pulsed laser light (i.e., one pulse of laser irradiation; laser shot), gather to yield the modified region 7. Examples of the modified spots include crack spots, molten processed spots, refractive index changed spots, and those in which at least one of them is mixed.

Preferably, for the modified spots, their sizes and lengths of fractures generated therefrom are controlled as appropriate in view of the required cutting accuracy, the demanded flatness of cut surfaces, the thickness, kind, and crystal orientation of the object, and the like.

Figure 7:
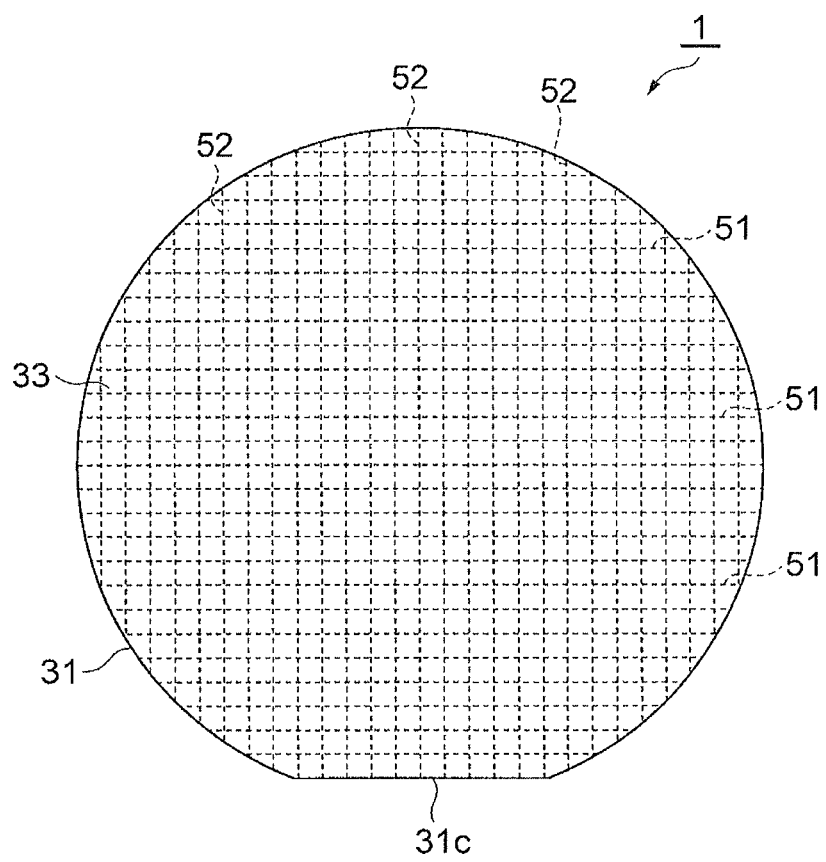
FIG. 7 is a plan view of the object to be subjected to the object cutting method in accordance with an embodiment of the present invention.
Figure 8:
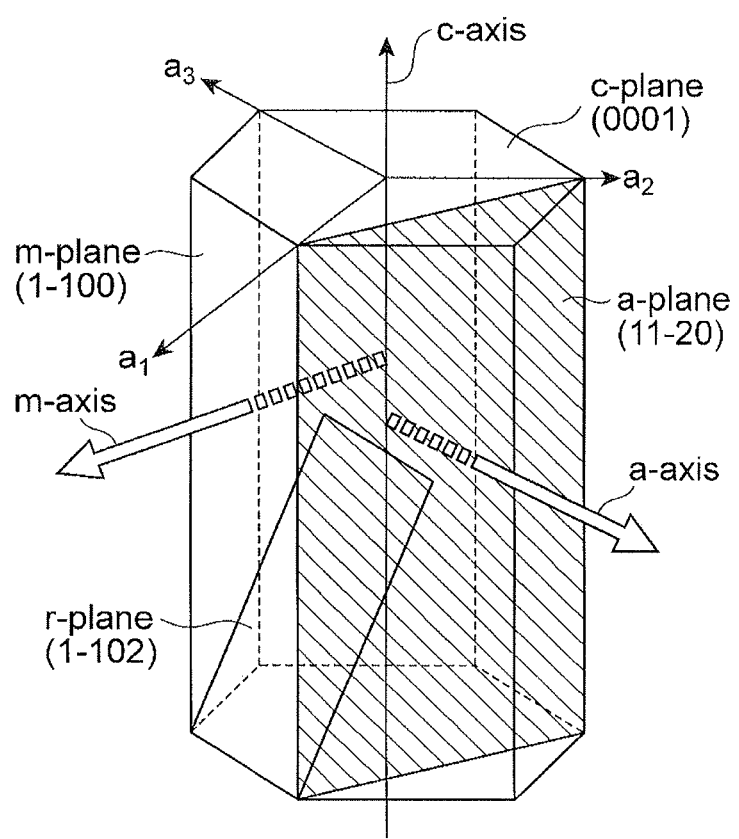
FIG. 8 is a unit cell diagram of a monocrystal sapphire substrate serving as the object of FIG. 7.
Figure 9:
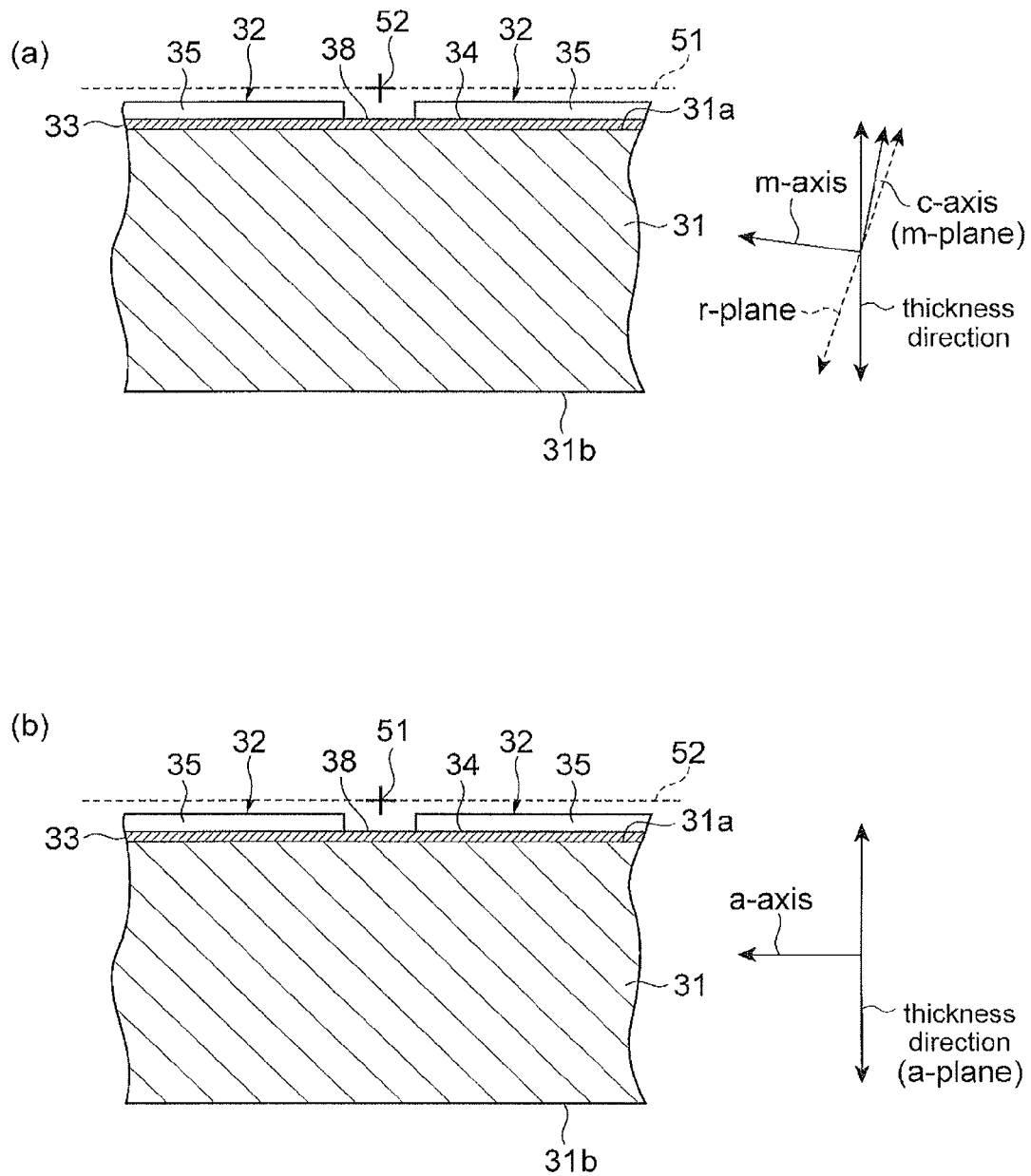
FIG. 9 is a sectional view of an object to be processed for explaining the object cutting method in accordance with the embodiment of the present invention.

The object cutting method in accordance with the embodiment of the present invention will now be explained in detail. As illustrated in FIG. 7, the object 1 is a wafer comprising a monocrystal sapphire substrate 31 having a disk shape (e.g., with a diameter of 2 to 6 inches and a thickness of 50 to 200 μm). As illustrated in FIG. 8, the monocrystal sapphire substrate 31 has a hexagonal crystal structure, whose c-axis is tilted by an angle θ (e.g., 0.1°) with respect to the thickness direction of the monocrystal sapphire substrate 31. That is, the monocrystal sapphire substrate 31 has an off-angle of the angle θ. As illustrated in FIG. 9, the monocrystal sapphire substrate 31 has front and rear faces 31a, 31b each forming the angle θ corresponding to the off-angle with the c-plane. In the monocrystal sapphire substrate 31, the m-plane is tilted by the angle θ with respect to the thickness direction of the monocrystal sapphire substrate 31 (see FIG. 9(a)), while the a-plane is parallel to the thickness direction of the monocrystal sapphire substrate 31 (see FIG. 9(b)).

As illustrated in FIGS. 7 and 9, the object 1 comprises an element layer 33 including a plurality of light-emitting element parts 32 arranged in a matrix on the front face 31a of the monocrystal sapphire substrate 31. In the object 1, lines to cut (second and first lines to cut) 51, 52 for cutting the object 1 with respect to each of the light-emitting element parts 32 are arranged into a grid (e.g., 300 μm×300 μm). A plurality of the lines 51 are set parallel to the a-plane and rear face 31b (i.e., parallel to the a-plane and front face 31a). A plurality of the lines 52 are set parallel to the m-plane and rear face 31b (i.e., parallel to the m-plane and front face 31a). The monocrystal sapphire substrate 31 is formed with an orientation flat 31c parallel to the a-plane.

Figure 10:
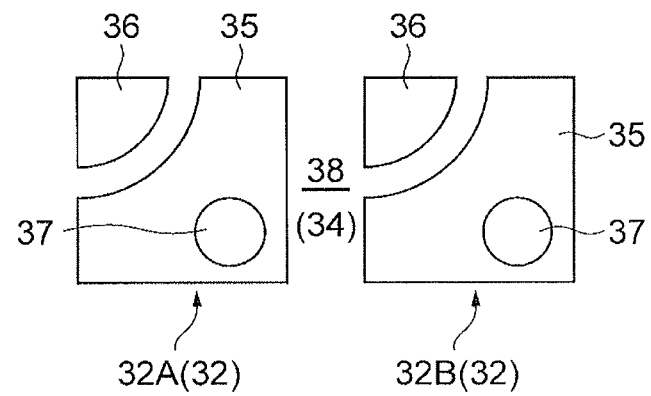
FIG. 10 is a plan view of the object for explaining a street region in the object in FIG. 7.
Figure 10:
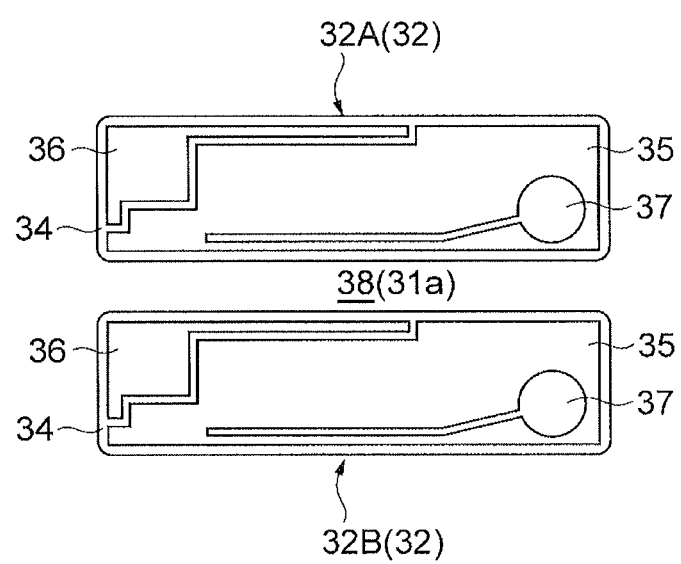

As illustrated in FIG. 9, each light-emitting element part 31 has an n-type semiconductor layer (first conduction type semiconductor layer) 34 mounted on the front face 31a of the monocrystal sapphire substrate 31 and a p-type semiconductor layer (second conduction type semiconductor layer) 35 mounted on the n-type semiconductor layer 34. The n-type semiconductor layer 34 is continuously formed all over the light-emitting element parts 32, while the p-type semiconductor layer 35 is formed into islands separated with respect to each of the light-emitting element parts 32. The n-type semiconductor layer 34 and p-type semiconductor layer 35 are made of a III-V compound semiconductor such as GaN, for example, and have a p-n junction therebetween. As illustrated in FIG. 10, the n-type semiconductor layer 34 is formed with electrode pads 36 for each of the light-emitting element parts 32, while the p-type semiconductor layer 35 is formed with electrode pads 37 for each of the light-emitting element parts 32. The n-type semiconductor layer 34 has a thickness of about 6 μm, for example, while the p-type semiconductor layer 35 has a thickness of about 1 μm, for example.

Between the light-emitting element parts 32, 32 adjacent to each other in the element layer 33, a street region 38 having a predetermined width (e.g., 10 to 30 μm) extends like a grid. When attention is focused on light-emitting element parts 32A, 32B adjacent to each other, the street region 38 is a region between a member having the outer edge closest to one light-emitting element part 32A in members exclusively possessed by the other light-emitting element part 32B and a member having the outer edge closest to the other light-emitting element part 32B in members exclusively possessed by the one light-emitting element part 32A.

In the case of FIG. 10(a), for example, the member having the outer edge closest to the light-emitting element part 32B in the members exclusively possessed by the light-emitting element part 32A is the p-type semiconductor layer 35, while the members having the outer edge closest to the light-emitting element part 32A in the members exclusively possessed by the light-emitting element part 32B are the electrode pad 36 and p-type semiconductor layer 35. Therefore, the street region 38 in this case is a region between the p-type semiconductor layer 35 of the light-emitting element part 32A and the electrode pad 36 and p-type semiconductor layer 35 of the light-emitting element part 32B. In the case of FIG. 10(a), the n-type semiconductor layer 34 shared by the light-emitting element parts 32A, 32B is exposed to the street region 38.

In the case of FIG. 10(b), on the other hand, the member having the outer edge closest to the light-emitting element part 32B in the members exclusively possessed by the light-emitting element part 32A is the n-type semiconductor layer 34, and the member having the outer edge closest to the light-emitting element part 32A in the members exclusively possessed by the light-emitting element part 32B is also the n-type semiconductor layer 34. Therefore, the street region 38 in this case is a region between the n-type semiconductor layer 34 of the light-emitting element part 32A and the n-type semiconductor layer 34 of the light-emitting element part 32B. In the case of FIG. 10(b), the front face 31a of the monocrystal sapphire substrate 31 is exposed to the street region 38.

Figure 11:
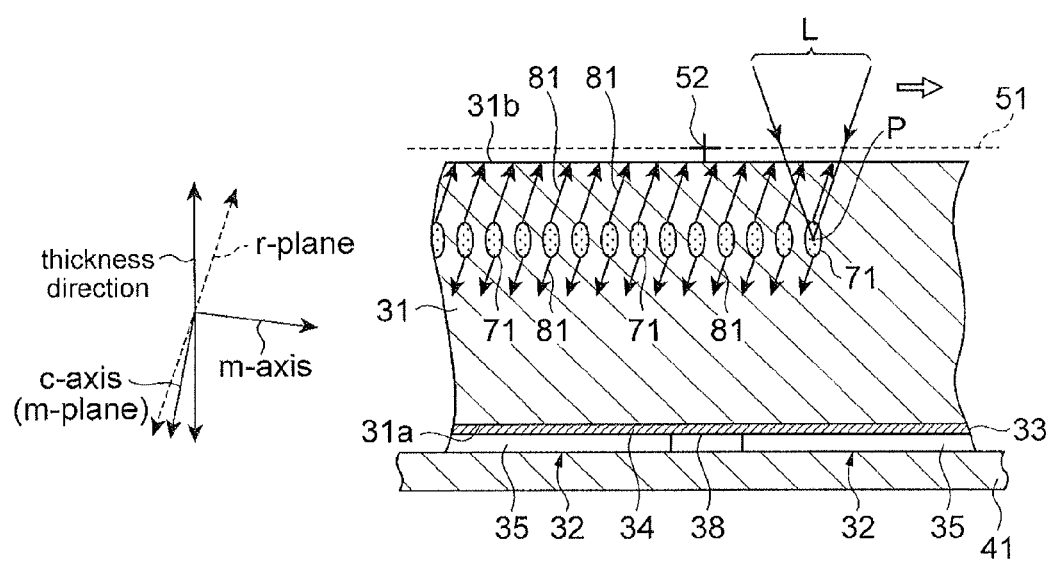
FIG. 11 is a sectional view of the object for explaining the object cutting method in accordance with the embodiment of the present invention.

An object cutting method for cutting thus constructed object 1 with respect to each of the light-emitting element parts 32 in order to manufacture a plurality of light-emitting elements will now be explained. First, as illustrated in FIG. 11, a protective tape 41 is attached to the object 1 so as to cover the element layer 33, and the object 1 is mounted on the support table 107 of the laser processing device 100 with the protective tape 41 interposed therebetween. Subsequently, while using the rear face 31b of the monocrystal sapphire substrate 31 as the entrance surface of the laser light L in the monocrystal sapphire substrate 31 and locating the converging point P of the laser light L within the monocrystal sapphire substrate 31, the converging point P is relatively moved along each of the lines 51. This forms modified regions (third modified regions) 71 within the monocrystal sapphire substrate 31 along each of the lines 51 and causes fractures (third fractures) 81 occurring from the modified regions 71 to reach the rear face 31b (third step). At this time, the fractures 81 also extend from the modified regions 71 toward the front face 31a of the monocrystal sapphire substrate 31 but do not reach the front face 31a.

In this step, assuming that the side on which the r-plane and rear face 31b of the monocrystal sapphire substrate 31 form an acute angle is one side while the side on which they form an obtuse angle is the other side, the converging point P of the laser light L is relatively moved from the one side to the other side in all of the lines 51. For example, the distance from the rear face 31b to the position where the converging point P is located is one half or less of the thickness of the monocrystal sapphire substrate 31, e.g., 30 to 50 µm.

Figure 12:
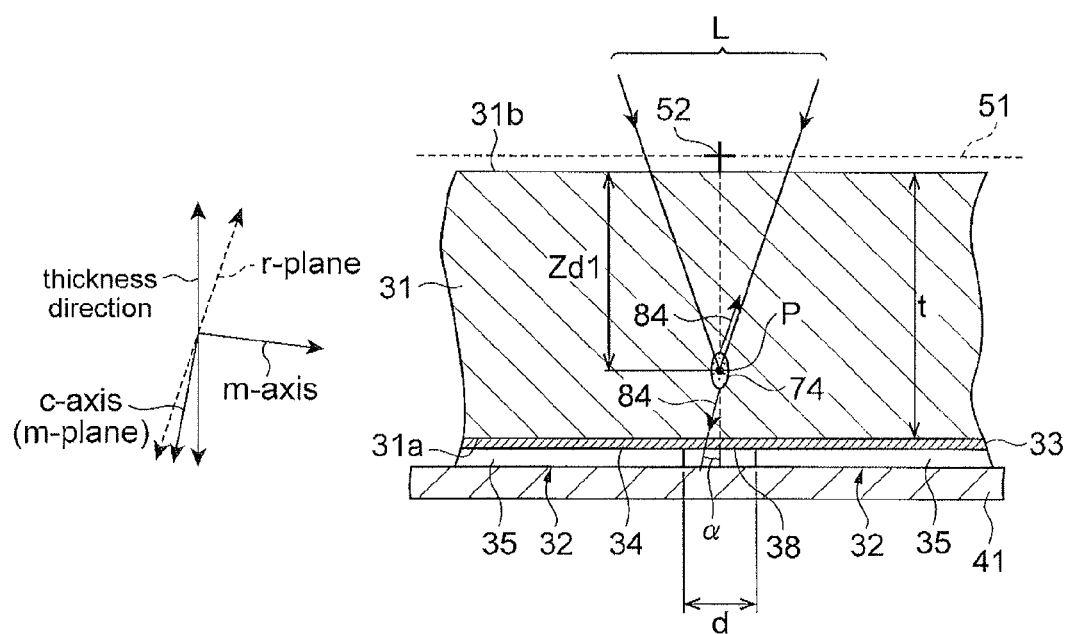
FIG. 12 is a sectional view of the object for explaining the object cutting method in accordance with the embodiment of the present invention.

Next, as illustrated in FIG. 12, the converging point P of the laser light L is relatively moved along one line to cut 52 while using the rear face 31b of the monocrystal sapphire substrate 31 as the entrance surface of the laser light L in the monocrystal sapphire substrate 31 and locating the converging point P at a position within the monocrystal sapphire substrate 31 separated by a distance (first distance) Zd1 from the rear face 31b. This forms a modified region (first modified region) 74 within the monocrystal sapphire substrate 31 along the one line 52. At this time, a fracture (first fracture) 84 occurring from the modified region 74 extends from the modified region 74 toward the front and rear faces 31a, 31b of the monocrystal sapphire substrate 31 but does not reach any of the front and rear faces 31a, 31b.

When forming the modified region 74, the object 1 is irradiated with the laser light L along the one line 52 so as to satisfy $t-[(d/2)-m]/\tan\alpha < Zd1 < t-e$, where e is the minimum allowable distance from a position where the converging point P is located to the front face 31a, t is the thickness of the monocrystal sapphire substrate 31, Zd1 is the distance from the rear face 31b to the position where the converging point P is located, d is the width of the street region 38 extending in a direction parallel to the m-plane between the light-emitting element parts 32, 32 adjacent to each other, m is the amount of meandering of the fracture 84 in the front face 31a, and α is the angle formed between the direction perpendicular to the rear face 31b (i.e., the thickness direction of the monocrystal sapphire substrate 31) and the fracture 84.

This can prevent characteristics of the light-emitting element parts 32 from deteriorating upon irradiation with the laser light L. Even when the extending direction of the fracture 84 is pulled toward the tilting direction of the r-plane at the time of cutting the object 1 along the line 52, the fracture 84 can be contained in the street region 38 in the front face 31a of the monocrystal sapphire substrate 31, whereby the fracture 81 can be prevented from reaching the light-emitting element parts 32.

Here, the minimum allowable distance e from a position where the converging point P is located to the front face 31a is such a distance that a characteristic of the light-emitting element parts 32 may deteriorate upon irradiation with the laser light L if the distance from the position where the converging point P is located to the front face 31a is shorter than the minimum allowable distance e, an example of which is 40 to 60 µm. The amount of meandering m of the fracture 84 in the front face 31a is an estimated maximum value of the range (in the width direction of the street region 38 (i.e., the direction in which the light-emitting element parts 32, 32 adjacent to each other are juxtaposed)) of the fracture 84 meandering in the front face 31a, an example of which is −5 to +5 µm. While the direction in which the fracture 84 extends is a direction inclined to the side on which the r-plane tilts with respect to the direction perpendicular to the rear face 31b, the angle α formed between the direction perpendicular to the rear face 31b and the direction in which the fracture 84 extends does not always coincide with the angle formed between the direction perpendicular to the rear face 31b and the r-plane, but may be 5 to 7°, for example.

Figure 13:
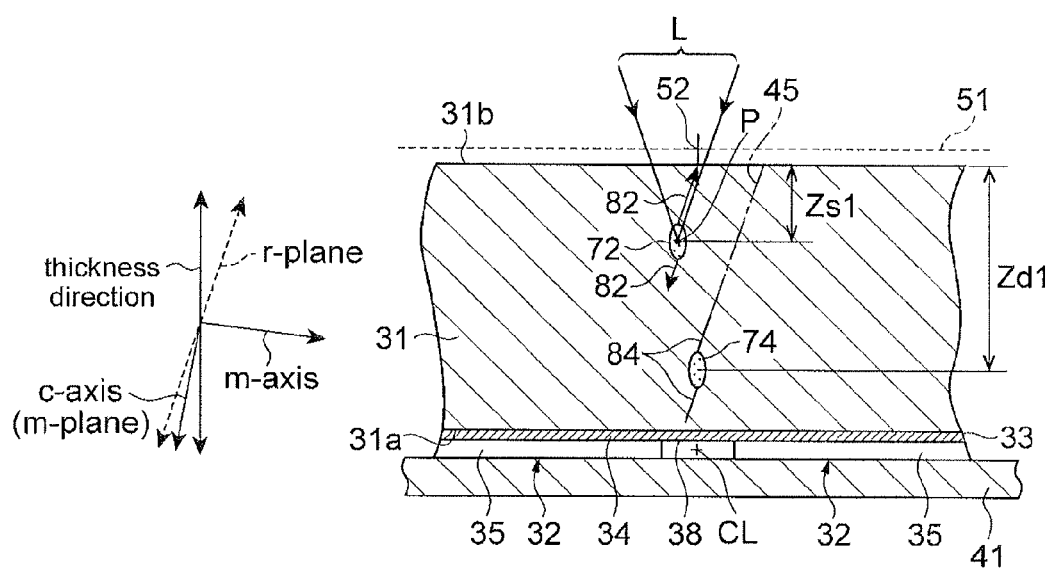
FIG. 13 is a sectional view of the object for explaining the object cutting method in accordance with the embodiment of the present invention.

Next, as illustrated in FIG. 13, the converging point P of the laser light L is relatively moved along the one line 52 while using the rear face 31b of the monocrystal sapphire substrate 31 as the entrance surface of the laser light L in the monocrystal sapphire substrate 31 and locating the converging point P at a position within the monocrystal sapphire substrate 31 separated by a distance Zs1 shorter than the distance Zd1 from the rear face 31b. This forms a modified region (second modified region) 72 within the monocrystal sapphire substrate 31 along the one line 52 and causes a fracture (second fracture) 82 occurring from the modified region 72 to reach the rear face 31b. At this time, the fracture 82 occurring from the modified region 72 also extends from the modified region 71 toward the front face 31a of the monocrystal sapphire substrate 31 but does not reach the front face 31a.

When forming the modified region 72, with respect to a tilted surface 45 passing the modified region 74 while being parallel to the r-plane of the monocrystal sapphire substrate 31, the modified region 72 is located on the side where the tilted surface 45 and the rear face 31b form an acute angle in each of the lines 52. More specifically, when seen in the direction perpendicular to the rear face 31b, the modified region 72 is positioned away from the tilted surface 45 than is a center line CL (which is the center line in the width direction of the street region 38 and coincides with the line 52 here) of the street region 38 so that the fracture 82 having reached the rear face 31b is located on the center line CL.

The modified regions 72, 74 are sequentially formed as in the foregoing for each of all the lines 52 (first step). When forming the modified region 72, an example of the distance from the position where the converging point P is located to the rear face 31b is one half or less of the thickness of the monocrystal sapphire substrate 31, e.g., 30 to 50 µm.

Here, the modified regions 71, 72, 74 formed within the monocrystal sapphire substrate 31 include molten processed regions. Appropriately adjusting irradiation conditions of the laser light L enables the fractures 81 occurring from the modified regions 71 to reach the rear face 31b of the monocrystal sapphire substrate 31. Examples of the irradiation conditions of the laser light L for the fractures 81 to reach the rear face 31b include the distance from the rear face 31b to the position at which the converging point P of the laser light L is located, the pulse width of the laser light L, the pulse pitch of the laser light L ("the moving speed of the laser light L with respect to the object 1" divided by "the repetition frequency of the laser light L"), and the pulse energy of the laser light L. Similarly, appropriately adjusting irradiation conditions of the laser light L enables the fractures 82 occurring from the modified regions 72 to reach the front face 31a of the monocrystal sapphire substrate 31. Examples of the irradiation conditions of the laser light L for the fractures 82 to reach the front face 31a include the distance from the rear face 31b to the position at which the converging point P of the laser light L is located, the pulse width of the laser light L, the pulse pitch of the laser light L, and the pulse energy of the laser light L. In the monocrystal sapphire substrate 31, the fractures 81 are hard to extend but easy to meander in the lines 51 set parallel to the a-plane and rear face 12b. On the other hand, the fractures 82, 84 are easy to extend but hard to meander in the lines 52 set parallel to the m-plane and rear face 12b. From this viewpoint, the pulse pitch of the laser light L on the line 51 side may be made smaller than that on the line 52 side.

Figure 14:
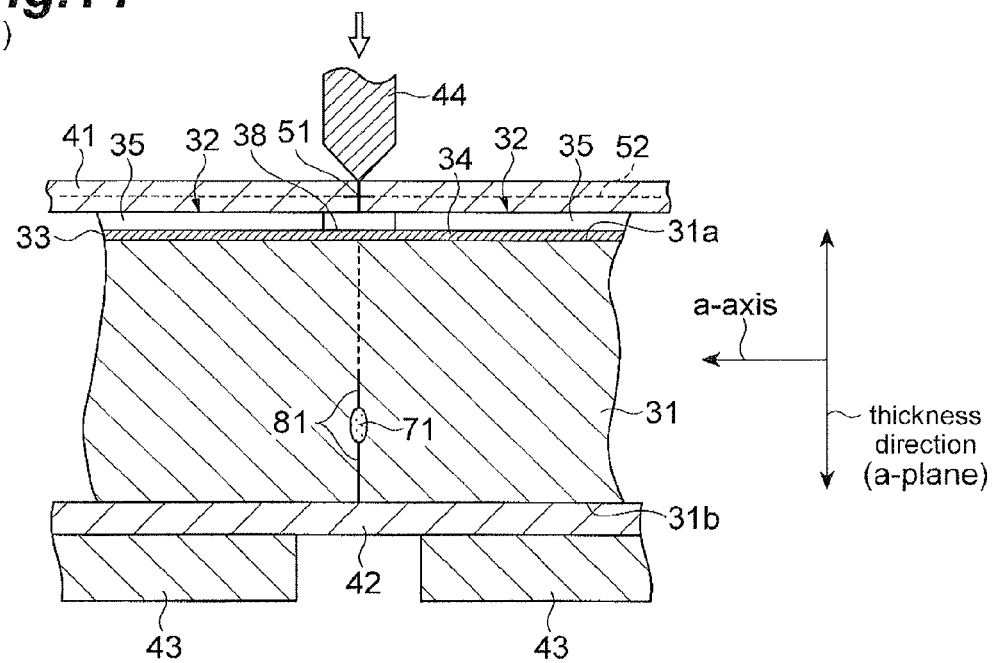
FIG. 14 is a sectional view of the object for explaining the object cutting method in accordance with the embodiment of the present invention.
Figure 14:
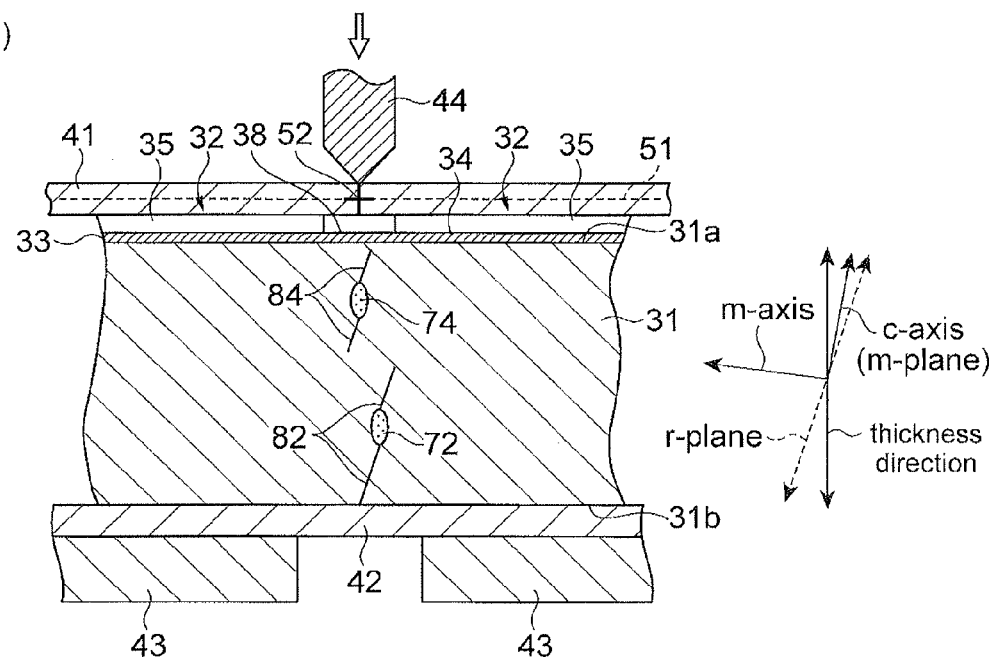

After forming the modified regions 71, 72, 74 as in the foregoing, as illustrated in FIG. 14, an expandable tape 42 is attached to the object 1 so as to cover the rear face 31b of the monocrystal sapphire substrate 31, and the object 1 is mounted on a receiving member 43 of a three-point bending breaking device with the expandable tape 42 interposed therebetween. Subsequently, as illustrated in FIG. 14(a), a knife edge 44 is pressed against the object 1 through the protective tape 41 from the front face 31a side of the monocrystal sapphire substrate 31 along each of the lines 51, so as to exert an external force on the object 1 along each of the lines 51. This causes the fractures 81 occurring from the modified regions 71 to extend toward the front face 31a, thereby cutting the object 1 into bars along each of the lines 51 (fourth step).

Then, as illustrated in FIG. 14(b), the knife edge 44 is pressed against the object 1 through the protective tape 41 from the front face 31a side of the monocrystal sapphire substrate 31 along each of the lines 52, so as to exert an external force on the object 1 along each of the lines 52. This causes the fractures 82 occurring from the modified regions 72 to extend, thereby cutting the object 1 into chips along each of the lines 52 (second step).

Figure 15:
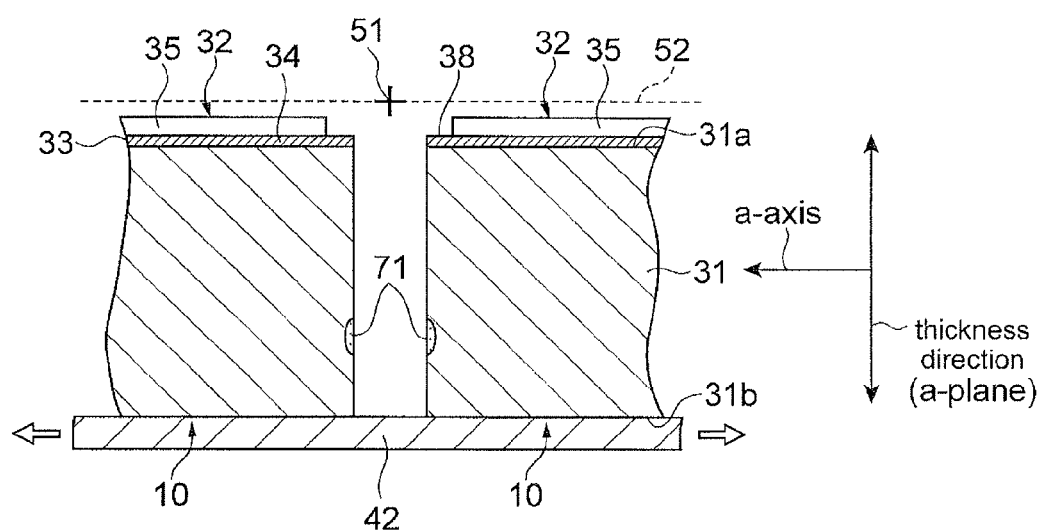
FIG. 15 is a sectional view of the object for explaining the object cutting method in accordance with the embodiment of the present invention.

After cutting the object 1, as illustrated in FIG. 15, the protective tape 41 is removed from the object 1, and the expandable tape 42 is expanded outward. As a consequence, a plurality of light-emitting elements 10, which were obtained by cutting the object 1 into the chips, are separated from each other.

In each of a plurality of lines to cut 52 which are set parallel to the m-plane and rear face 31b of the monocrystal sapphire substrate 31, with respect to the tilted surface 45 passing the modified region 74 while being parallel to the m-plane and rear face 31b of the monocrystal sapphire substrate 31, the object cutting method of this embodiment positions the modified region 72 on the side where the tilted surface 45 and rear face 31b form an acute angle as explained in the foregoing. This enables the fracture 84 extending from the modified region 74 toward the rear face 31b to extend toward the modified region 72 and the fracture 82 extending from the modified region 72 toward the front face 31a to extend toward the modified region 74, whereby the fractures 84, 82 connect with each other within the monocrystal sapphire substrate 31. Hence, the fracture 84 occurring from the modified region 74 on the front face 31a side can be contained in the street region 38, while the fracture 82 occurring from the modified region 72 on the rear face 31b side is restrained from extending to the front face 31a of the monocrystal sapphire substrate 31, whereby the fractures 82, 84 can be prevented from reaching the light-emitting element parts 32.

The step of cutting the object 1 presses the knife edge 44 against the object 1 from the front face 31a side of the monocrystal sapphire substrate 31 along each of the lines 51, 52, so as to exert an external force on the object 1 along each of the lines 51, 52. As a consequence, the external force acts on the object 1 such that the fractures 81, 82 having reached the rear face 31b of the monocrystal sapphire substrate 31 open, whereby the object 1 can be cut easily and accurately along the lines 51, 52.

Forming a plurality of rows of modified regions 72, 74 for one line to cut 52 makes it possible to cut the object 1 easily and accurately along the line 52 even when the monocrystal sapphire substrate 31 is relatively thick. This can also lower the pulse energy of the laser light L for forming one of the modified regions 72, 74, thereby making it possible to prevent characteristics of the light-emitting element parts 32 from deteriorating upon irradiation with the laser light L.

In each of a plurality of lines to cut 51 which are set parallel to the a-plane and rear face 31b of the monocrystal sapphire substrate 31, the converging point P of the laser light L is relatively moved from one side to the other side. This can restrain the fractures 81 occurring from the modified regions 71 formed along each of the lines 51 from changing their amount of meandering. This is based on the finding that the state of formation of the modified regions 71 varies between the cases where the converging point P of the laser light L is moved from the respective sides where the r-plane and the rear face 31b form acute and obtuse angles to the opposite side and thereby changes the amount of meandering of the fractures 81 occurring from the modified regions 71. Hence, this object cutting method can inhibit the amount of meandering of the fractures 82 occurring from the modified regions 71 formed along each of a plurality of lines to cut 51 parallel to the a-plane and rear face 31b of the monocrystal sapphire substrate 31 from fluctuating. By the amount of meandering of the fractures 81 occurring from the modified regions 71 is meant the range (in the width direction of the street region 38) of the fractures 81 meandering in the front face 31a or rear face 31b of the monocrystal sapphire substrate 31.

Assuming that the side on which the angle formed between the r-plane and rear face 31b of the monocrystal sapphire substrate 31 is an acute angle is one side while the side on which the angle is an obtuse angle is the other side, the step of forming the modified regions 71 relatively moves the converging point P of the laser light L from the one side to the other side in each of the lines 51, so as to form the modified regions 71 within the substrate 31 and cause the fractures 81 occurring from the modified regions 71 to reach the rear face 31b. As a consequence, the amount of meandering of the fractures 81 reaching from the modified regions 71 to the rear face 31b of the monocrystal sapphire substrate 31 can be made smaller than that in the case where the converging point P of the laser light L is relatively moved from the side on which the angle formed between the r-plane and rear face 31b of the monocrystal sapphire substrate 31 is an obtuse angle to the side on which the angle is an acute angle.

Figure 16:
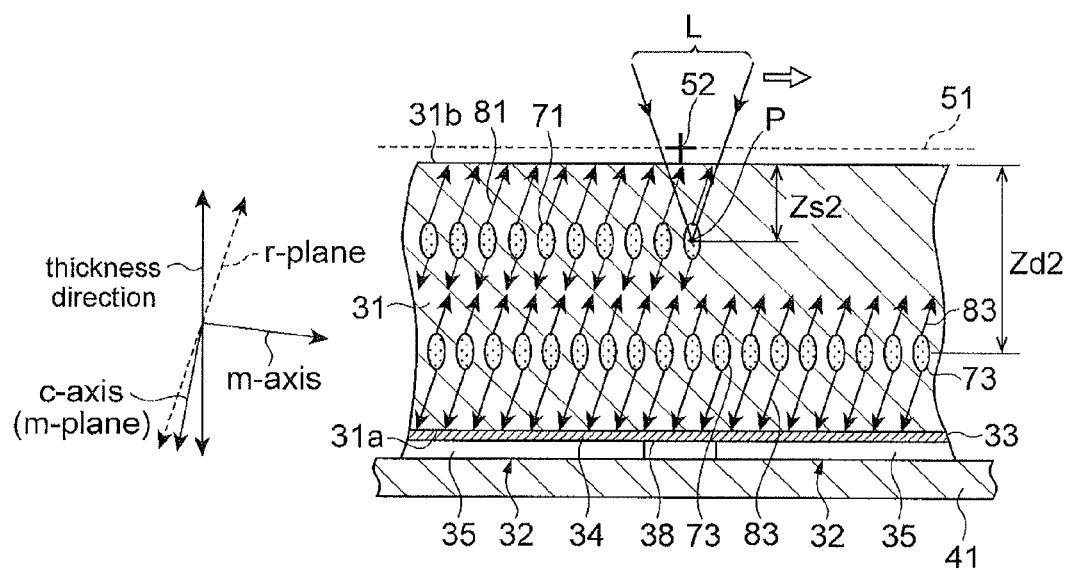
FIG. 16 is a sectional view of the object for explaining the object cutting method in accordance another embodiment of the present invention.

Meanwhile, a plurality of rows of modified regions 71, 73 may be formed for one line to cut 51 as follows. First, as illustrated in FIG. 16, while using the rear face 31b of the monocrystal sapphire substrate 31 as the entrance surface of the laser light L in the monocrystal sapphire substrate 31 and locating the converging point P of the laser light L at a position within the monocrystal sapphire substrate 31 separated by a distance Zd2 from the rear face 31b, the converging point P is relatively moved along one line to cut 51. This forms the modified region (third modified region) 73 within the monocrystal sapphire substrate 31 along the one line 51. At this time, a fracture (third fracture) 83 occurring from the modified region 73 extends from the modified region 73 toward the front and rear faces 31a, 31b of the monocrystal sapphire substrate 31 but does not reach any of the front and rear faces 31a, 31b.

When forming the modified region 73, assuming that the side on which the r-plane and rear face 31b of the monocrystal sapphire substrate 31 form an acute angle is one side while the side on which they form an obtuse angle is the other side, the converging point P is relatively moved from the other side to the one side along the one line 51.

Subsequently, while using the rear face 31b of the monocrystal sapphire substrate 31 as the entrance surface of the laser light L in the monocrystal sapphire substrate 31 and locating the converging point P of the laser light L at a position within the monocrystal sapphire substrate 31 separated by a distance Zs2 shorter than the distance Zd1 from the rear face 31b, the converging point P is relatively moved along the one line to cut 51. This forms the modified region 71 within the monocrystal sapphire substrate 31 along the one line 51 and causes the fracture 81 occurring from the modified region 71 to reach the rear face 31b. At this time, the fracture 81 occurring from the modified region 71 also extends from the modified region 71 to the front face 31a of the monocrystal sapphire substrate 31 but does not reach the front face 31a.

When forming the modified region 71, assuming that the side on which the r-plane and rear face 31b of the monocrystal sapphire substrate 31 form an acute angle is one side while the side on which they form an obtuse angle is the other side, the converging point P is relatively moved from the one side to the other side along the one line 51.

The modified regions 71, 73 are sequentially formed as in the foregoing for each of all the lines 51 (first step). When forming the modified region 73, the distance from the position where the converging point P is located to the front face 31a is made not shorter than the minimum allowable distance e.

Forming a plurality of rows of modified regions 71, 73 for one line to cut 51 makes it possible to cut the object 1 easily and accurately along the line 51 even when the monocrystal sapphire substrate 31 is relatively thick. This can also lower the pulse energy of the laser light L for forming one of the modified regions 71, 73, thereby making it possible to prevent characteristics of the light-emitting element parts 32 from deteriorating upon irradiation with the laser light L.

While the object cutting method in accordance with one embodiment of the present invention is explained in the foregoing, the object cutting method of the present invention is not limited thereto.

For example, the step of forming the modified regions 71 along the lines 51 is not limited to the one mentioned above. The above-mentioned effect concerning the lines 52 of making it possible for the fractures 84 occurring from the modified regions 74 on the front face 31a side to be contained in the street region 38 while keeping the fractures 82 occurring from the modified regions 72 on the rear face 31b side from extending to the front face 31a of the monocrystal sapphire substrate 31, whereby the fractures 82, 84 are prevented from reaching the light-emitting element parts 32, and the like are exhibited regardless of how the modified regions 71 are formed along the lines 51.

Figure 17:
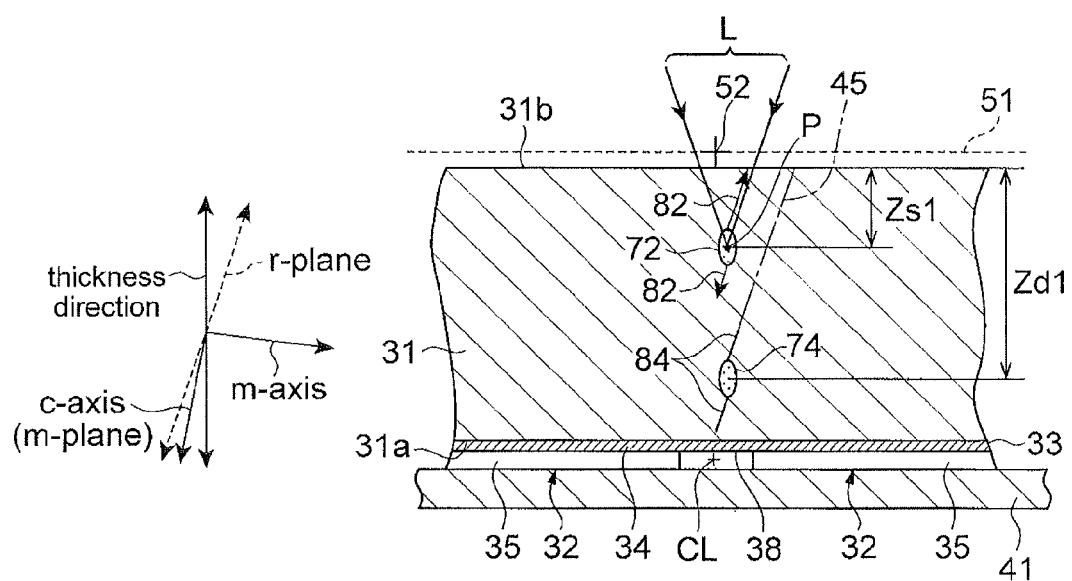
FIG. 17 is a sectional view of the object for explaining the object cutting method in accordance with the other embodiment of the present invention.

When forming the modified region 72, as illustrated in FIG. 17, the modified region 72 may be positioned on the side closer to the tilted surface 45 than is the center line CL of the street region 38 so that the fracture 82 having reached the rear face 31b is located between the center line CL and the tilted surface 45 having reached the rear face 31b when seen in the direction perpendicular to the rear face 31b. It is only necessary for the modified region 72 to be formed along the line 52 such that the fracture 82 having reached the rear face 31b is located within the street region 38 or between the center line CL of the street region 38 and the tilted surface 45 having reached the rear face 31b.

When forming a plurality of rows of modified regions for one line to cut, the modified regions may be formed continuously for each line and sequentially for all the lines. Alternatively, modified regions located at an identical distance from the rear face 31b may be formed continuously, and then modified regions located at another identical distance from the rear face 31b may be formed continuously.

Either one of the step of forming the modified regions along the lines 51 and the step of forming the modified regions along the lines 52 may be performed earlier than the other as long as they occur before the step of cutting the object 1. Either one of the step of cutting the object 1 along the lines 51 and the step of cutting the object 1 along the lines 52 may be performed earlier than the other as long as they occur after the steps of forming the modified regions.

For relatively moving the converging point P of the laser light L along each of the lines 51, 52, the support table 107 of the laser processing device 100, parts on the laser light source 101 side of the laser processing device 100 (the laser light source 101, dichroic mirror 103, condenser lens 105, and the like), or both of them may be moved.

Semiconductor lasers may be manufactured as light-emitting elements. In this case, the object 1 comprises the monocrystal sapphire substrate 31, the n-type semiconductor layer (first conduction type semiconductor layer) 34 mounted on the front face 31a of the monocrystal sapphire substrate 31, an active layer mounted on the n-type semiconductor layer 34, and the p-type semiconductor layer (second conduction type semiconductor layer) 35 mounted on the active layer. The n-type semiconductor layer 34, active layer, and p-type semiconductor layer 35 are made of a III-V compound semiconductor such as GaN, for example, and construct a quantum well structure.

The element layer 33 may further comprise a contact layer for electrical connection with the electrode pads 36, 37. The first and second conduction types may be p- and n-types, respectively. The off-angle of the monocrystal sapphire substrate 31 may also be 0°. In this case, the front and rear faces 31a, 31b of the monocrystal sapphire substrate 31 become parallel to the c-plane.

INDUSTRIAL APPLICABILITY

The present invention can provide an object cutting method which can prevent fractures occurring from modified regions formed along each of a plurality of lines to cut which are parallel to the m-plane and rear face of a monocrystal sapphire substrate from reaching light-emitting element parts.

REFERENCE SIGNS LIST

1: object to be processed; 10: light-emitting element; 31: monocrystal sapphire substrate; 31a: front face; 31b: rear face; 32: light-emitting element part; 33: element layer; 44: knife edge; 45: tilted surface; 51: line to cut (second line to cut); 52: line to cut (first line to cut); 71, 73: modified region (third modified region); 72: modified region (second modified region); 74: modified region (first modified region); 81, 83: fracture (third fracture); 82: fracture (second fracture); 84: fracture (first fracture); L: laser light; P: converging point.

The invention claimed is:

1. An object cutting method for manufacturing a plurality of light-emitting elements by cutting an object to be processed, comprising a monocrystal sapphire substrate having front and rear faces forming an angle corresponding to an off-angle with c-plane and an element layer including a plurality of light-emitting element parts arranged in a matrix on the front face, with respect to each of the light-emitting element parts, the method comprising:
 a first step of locating a converging point of laser light at a position separated by a first distance from the rear face within the monocrystal sapphire substrate, while using the rear face as an entrance surface of laser light in the monocrystal sapphire substrate, and relatively moving the converging point along each of a plurality of first lines to cut set parallel to m-plane of the monocrystal sapphire substrate and the rear face, so as to form first modified regions within the monocrystal sapphire substrate along each of the first lines, and locating the converging point at a position separated by a second distance shorter than the first distance from the rear face within the monocrystal sapphire substrate, while using the rear face as the entrance surface of laser light in the monocrystal sapphire substrate, and relatively moving the converging point along each of the first lines, so as to form second modified regions within the monocrystal sapphire substrate along each of the first lines; and
 a second step of exerting an external force on the object along each of the first lines after the first step, so as to extend a first fracture occurring from the first modified regions and a second fracture occurring from the second modified regions, thereby cutting the object along each of the first lines;
 wherein, in the first step, when seen in a direction parallel to the first lines, with respect to a tilted surface passing the first modified regions while being parallel to r-plane of the monocrystal sapphire substrate, the second modified regions are positioned on a region on one side with respect to each of the first lines and on the one side with respect to the first modified regions, assuming that a side where the tilted surface and rear face form an acute angle is the one side while a side where the tilted surface and rear face form an obtuse angle is the other side.

2. An object cutting method according to claim 1, wherein in the first step, the converging point is located at the position separated by the second distance from the rear face within the monocrystal sapphire substrate, while using the rear face as the entrance surface of laser light in the monocrystal sapphire substrate, and the converging point is relatively moved along each of the first lines, so as to form the second modified regions within the monocrystal sapphire substrate along each of the first lines and cause the second fracture to reach the rear face; and
 wherein, in the second step, the external force is exerted on the object along each of the first lines by pressing a knife edge against the object from the front face side along each of the first lines.

3. An object cutting method according to claim 1, further comprising a third step of locating the converging point within the monocrystal sapphire substrate, while using the rear face as the entrance surface, and relatively moving the converging point along each of a plurality of second lines to cut set parallel to a-plane of the monocrystal sapphire substrate and the rear face, so as to form third modified regions within the monocrystal sapphire substrate along each of the second lines before the second step; and
 a fourth step of exerting an external force on the object along each of the second lines after the first and third steps, so as to extend a third fracture occurring from the third modified regions, thereby cutting the object along each of the second lines.

* * * * *